(12) United States Patent
Kihara et al.

(10) Patent No.: US 6,190,841 B1
(45) Date of Patent: Feb. 20, 2001

(54) PATTERN FORMING PROCESS AND A PHOTOSENSITIVE COMPOSITION

(75) Inventors: Naoko Kihara, Chiba-Ken; Satoshi Saito; Toru Ushirogouchi, both of Kanagawa-Ken, all of (JP)

(73) Assignee: Kabushiki Kaisha Toshiba, Kawasaki (JP)

(*) Notice: Under 35 U.S.C. 154(b), the term of this patent shall be extended for 0 days.

(21) Appl. No.: 09/217,580

(22) Filed: Dec. 21, 1998

(30) Foreign Application Priority Data

Dec. 26, 1997 (JP) ...................................... 9-360741

(51) Int. Cl.$^7$ .............................. G03C 5/56; G03F 7/213; G03F 7/30
(52) U.S. Cl. .......................... 430/326; 430/330; 430/331; 430/270.1; 430/281.1
(58) Field of Search ..................................... 430/326, 330, 430/331, 328, 270.1, 271.1, 281.1, 905, 914, 191, 192

(56) References Cited

U.S. PATENT DOCUMENTS

| | | | |
|---|---|---|---|
| 5,019,488 | * | 5/1991 | Mammato et al. .................. 430/330 |
| 5,545,509 | * | 8/1996 | Cameron et al. .................. 430/270.1 |
| 5,650,261 | * | 7/1997 | Winkle ................................. 430/326 |

FOREIGN PATENT DOCUMENTS

| | | | |
|---|---|---|---|
| 9-134003 | | 5/1997 | (JP) . |
| 4226464 A1 | * | 2/1994 | (SE) . |

OTHER PUBLICATIONS

English translation of DE 4226464 A1 (Translated by Diplomatic Language Services, Inc.).*

* cited by examiner

*Primary Examiner*—Janet Baxter
*Assistant Examiner*—Sin J. Lee
(74) *Attorney, Agent, or Firm*—Oblon, Spivak, McClelland, Maier & Neustadt, P.C.

(57) ABSTRACT

The present invention provides a pattern forming process. The process comprises the following steps.

(1) A photosensitive material is prepared by coating a photosensitive composition onto the surface of a substrate. The photosensitive composition comprises the following components:
   (a) an acid generator which generates an acid when irradiated with actinic radiation, and
   (b) a compound containing carboxyl groups, which can decompose upon decarboxylation.
(2) The photosensitive material is subjected to patternwise exposure to actinic radiation, thereby allowing the acid generator (a) to generate an acid in the exposed area.
(3) The acid generated in the exposed area is neutralized with a basic compound (c).
(4) The carboxyl groups in the carboxyl-group-containing compound (b) in the unexposed area are decarboxylated by applying conditions under which the basic compound (c) can catalyze decarboxylation.
(5) The photosensitive material, and composition used in the above process are developed. The basic compound (c) can be introduced in advance into the photosensitive material prepared in step (1). By using such a pattern forming process or a photosensitive composition, a pattern can successfully be formed with high reproducibility without being affected by the environment.

13 Claims, 3 Drawing Sheets

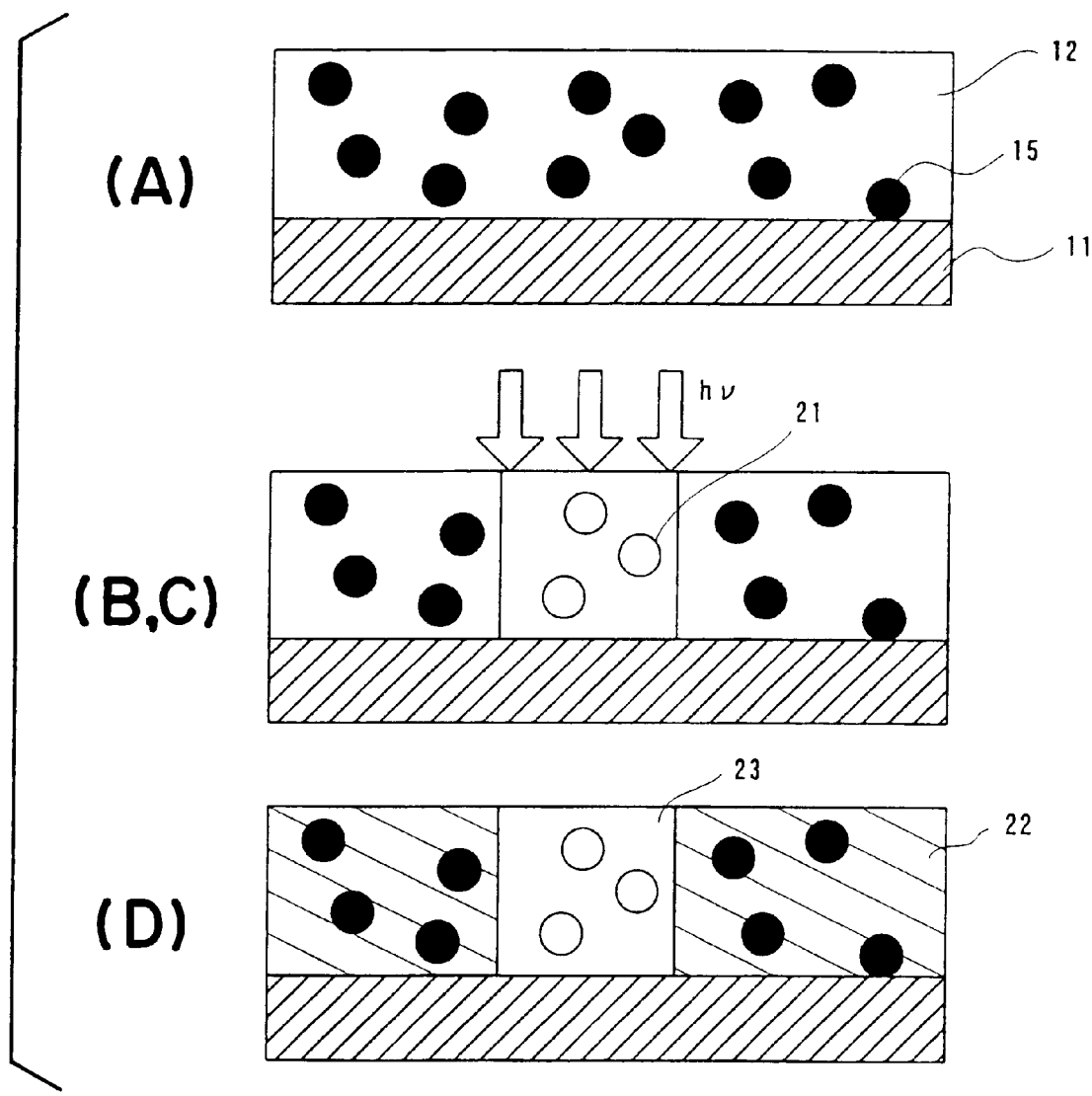
F I G. 2

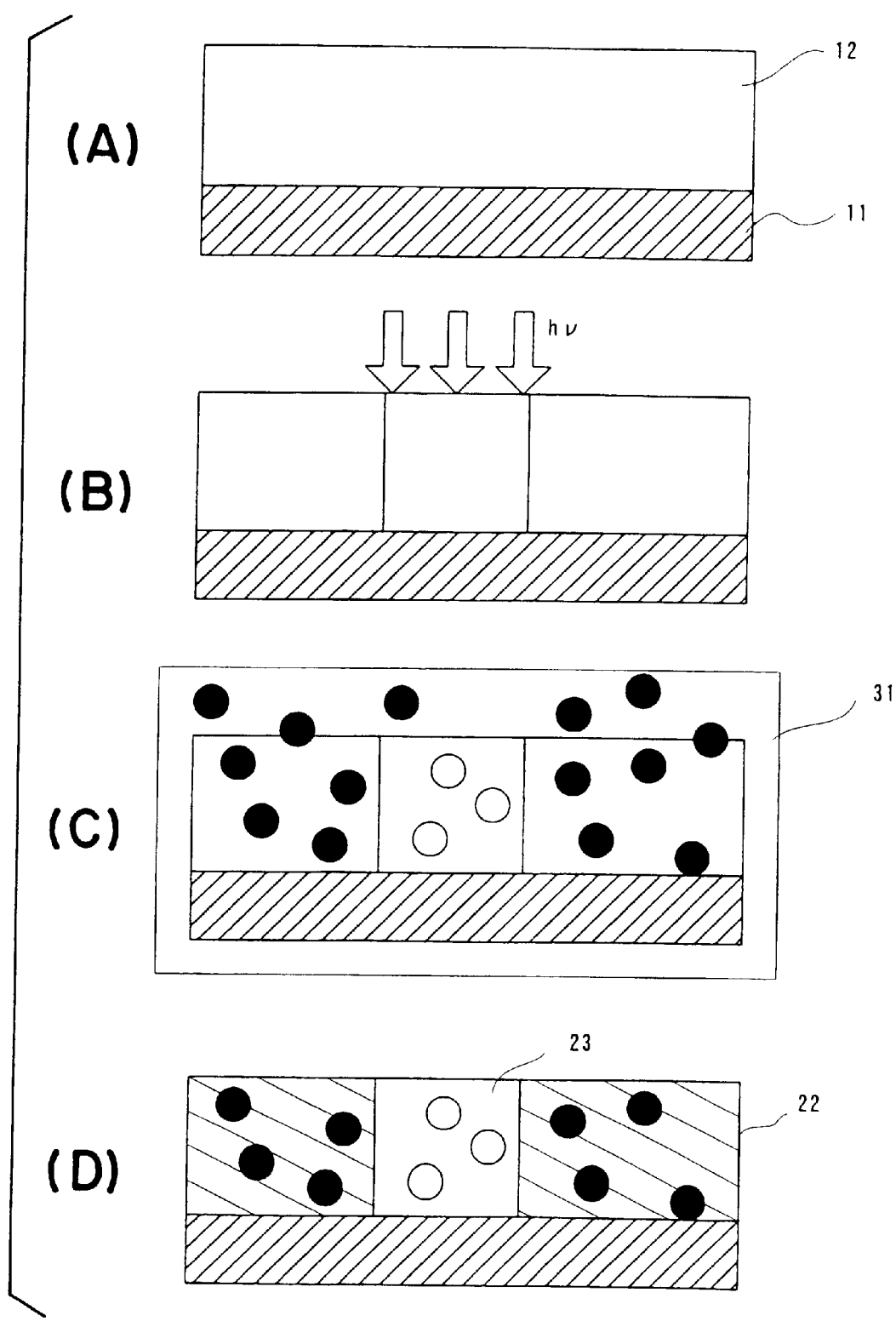
F I G. 3

PATTERN FORMING PROCESS AND A PHOTOSENSITIVE COMPOSITION

FIELD OF THE INVENTION

The present invention relates to a pattern forming process useful for fine patterning which is conducted in manufacturing processes of semiconductor elements or the like, and to a photosensitive composition.

BACKGROUND OF THE INVENTION

In manufacturing processes of electronic components such as LSIs, fine pattern techniques utilizing photolithography have conventionally been adopted. Namely, a resist solution is first coated onto the surface of a substrate or the like to form a resist film; and the resist film is subjected to pattern-wise exposure to light, or scanned by beams, and then developed by an alkaline developer to form a resist pattern. Subsequently, the substrate or the like is etched by utilizing this resist pattern as a mask to form minute lines and openings; and the remaining resist is finally removed.

To attain higher integration, there has also been studied the application of electron beam lithography to mass production as a method for precisely forming patterns at levels of sub-quarter microns or less. In general, however, electron beam lithography has such a drawback that it is poor in throughput as compared with conventional light projection. In order to overcome this drawback, studies are now being conducted on resists having high sensitivity to electron beams, particularly chemically sensitized resists.

In the case where a chemically amplified resist is used, a pattern is formed due to the difference in dissolution rate between the exposed area and unexposed area, which is produced by a reaction between the resist and an extremely small amount of an acidic catalyst generated by exposure. The acid generated may be deactivated by an extremely small amount of basic compounds present in the atmospheric environment, by basic compounds existing on the surface of a substrate on which the resist has been coated, by the surface of a substrate which shows the acid-trapping action, or by others. Therefore, there is such a possibility that the reproducibility of the characteristics of the resist, or the profile of the resist pattern is impaired. For this reason, an in-line system or the like in which no stagnation is caused in a series of steps from coating to development is required for manufacturing processes using chemically amplified resists. Moreover, chemically amplified resists are required to be used in an atmosphere which is cleaner than ever.

Thus, conventional chemically amplified resists tend to be affected, during the period between their production and use, by the environment or by materials used for their production. Therefore, it has been difficult to obtain patterns with high reproducibility by applying the resists to lithographic processes.

SUMMARY OF THE INVENTION

A pattern forming process of the present invention comprises the following steps of:

(1) preparing a photosensitive material by coating, onto the surface of a substrate, a photosensitive composition comprising the following components:
  (a) an acid generator which generates an acid when irradiated with actinic radiation, and
  (b) a compound containing carboxyl groups, which can decompose upon decarboxylation, (2) subjecting the photosensitive material to pattern-wise exposure to actinic radiation, thereby allowing the acid generator (a) to generate an acid in the exposed area, (3) neutralizing the acid generated in the exposed area with a basic compound (c), (4) allowing the carboxyl group in the carboxyl-group-containing compound (b) in the unexposed area to cause decarboxylation by applying conditions under which the decarboxylation proceeds by being catalyzed by the basic compound (c), and (5) developing the photosensitive material.

The present invention also relates to a photosensitive composition comprising the following components:

(a) an acid generator which generates an acid when irradiated with actinic radiation, (b) a carboxyl-group-containing compound which can decompose upon decarboxylation, and (c) a basic compound.

By the use of the pattern forming process of the present invention, a pattern can be formed with high reproducibility, without being affected by basic impurities present in the environment, especially in the air, or on the surface of a substrate.

Further, according to the present invention, there can be obtained a photosensitive composition with which a pattern can be formed with high reproducibility, without being affected by basic impurities present in the environment, especially in the air, or on the surface of a substrate.

BRIEF DESCRIPTION OF THE DRAWING

In the drawings,

FIG. 2 is a diagram showing the mechanism of pattern formation in a pattern forming process of the present invention in which the photosensitive material contains the basic compound as a resist component; and FIG. 3 is a diagram showing the mechanism of pattern formation in a pattern forming process of the present invention in which the basic compound is introduced into the photosensitive material which has been subjected to exposure.

DETAILED DESCRIPTION OF THE INVENTION

<Pattern Forming Process>

Figure 1:
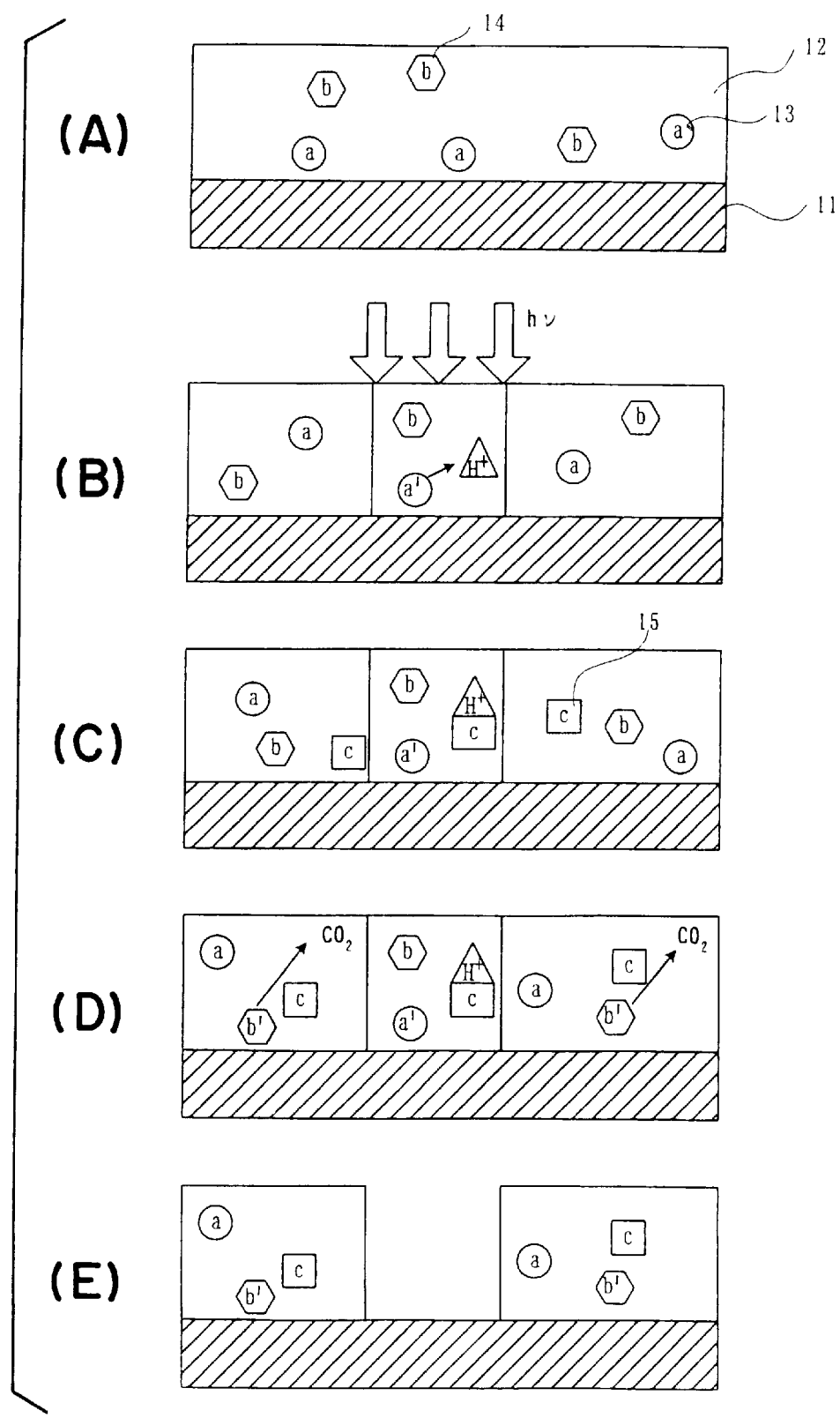
FIG. 1 is a diagram showing the mechanism of pattern formation in a pattern forming process of the present invention.

A pattern forming process of the present invention comprises the following steps:

(1) preparing a photosensitive material by coating, onto the surface of a substrate, a photosensitive composition comprising the following components:
  (a) an acid generator which generates an acid when irradiated with actinic radiation, and
  (b) a compound having carboxyl group, which can decompose upon decarboxylation, (2) subjecting the photosensitive material to pattern-wise exposure to actinic radiation, thereby allowing the acid generator (a) to generate an acid in the exposed area, (3) neutralizing the acid generated in the exposed area with a basic compound (c), (4) allowing the carboxyl group in the carboxyl-group-containing compound (b) in the unexposed area to cause decarboxylation by applying conditions under which the decarboxylation proceeds by being catalyzed by the basic compound (c), and (5) developing the photosensitive material.

The presumed mechanism of pattern formation in this process will be described hereinafter by referring to FIG. 1.

First of all, a photosensitive material is prepared in step (1) by coating, onto the surface of a substrate 11, a photosensitive composition 12 comprising an acid generator (a) 13 which generates an acid when irradiated with actinic radiation (hereinafter referred to as acid generator), and a compound (b) 14 containing carboxyl group, which can decompose by causing decarboxylation (hereinafter referred to as carboxyl-group-containing compound) (FIG 1(A)).

Subsequently, this photosensitive material is subjected, in step (2), to pattern-wise exposure to actinic radiation. The acid generator generates an acid in the exposed area due to the actinic radiation, while no acid is generated in the unexposed area (FIG 1(B)).

In step (3), the acid generated in the exposed area is neutralized with a basic compound (c), and the concentration of the free basic compound is thus lowered. On the other hand, the basic compound is not used for neutralization in the unexposed area (FIG 1(C)). As a result, a difference in the concentration of the basic compound is produced between the exposed area and unexposed area.

In the step (4), the free basic compound acts as a catalyst for the decarboxylation of the carboxyl-group-containing compound. By utilizing this catalytic action, and when conditions under which the decarboxylation proceeds are applied, the carboxyl group-containing-compound becomes decarboxylated. Therefore, the decarboxylation of the carboxyl-group-containing compound does not or hardly proceed in the exposed area in which the concentration of the basic compound has been lowered. As a result, the carboxyl-group-containing compound in the exposed area remains in the state of being readily soluble in a developer. On the other hand, the concentration of the basic compound is relatively high in the unexposed area, so that the carboxyl-group-containing compound (b) becomes decarboxylated and is thus converted to a compound (b') which is sparingly soluble in a developer (FIG 1(D)).

As a result, a dissolution rate contrast is obtained between the exposed area and unexposed area. When this photosensitive material is developed, only the unexposed area remains on the substrate to form a positive image (FIG 1(E)).

In the process of the present invention, the photosensitive material prepared in step (1) can contain the basic compound as a resist component. Alternatively, the basic compound can be introduced into the photosensitive material in step (3). The mechanisms of pattern formation in these cases will now be described by referring to FIGS. 2 and 3. In these figures, the acid generator and carboxyl-group-containing compound are omitted for simplification.

In the case where the basic compound is incorporated into the photosensitive material as a resist component, a photosensitive material comprising an acid generator, a carboxyl-group-containing compound and a basic compound 15 is first prepared (FIG. 2(A)).

When the photosensitive material is exposed to actinic radiation in step (2), the basic compound 15 is neutralized with an acid generated by the acid generator. The circles, numbered 21 in FIG. 2(B, C) denote the basic compounds neutralized by generated acid. In this case, the exposure step (2) and the neutralization step (3) are to be effected in parallel (FIG. 2(B, C)).

Subsequently, as decarboxylation proceeds in step (4), an area 22 which is sparingly soluble in a developer, and an area 23 which is soluble in a developer are formed due to the difference in the concentration of the basic compound (FIG. 2(D)).

On the other hand, in the case where the photosensitive material prepared in step (1) contains no basic compound, a photosensitive material comprising an acid generator and a carboxyl-group-containing compound is first prepared (FIG. 3(A)).

When the photosensitive material is exposed to actinic radiation in the step (2), an acid is generated in the exposed area from the acid generator. A difference in the concentration of the acid is thus produced between the exposed area and unexposed area (FIG 3(B)).

Subsequently, a basic compound is introduced into this photosensitive material. Any manner can be adopted to introduce a basic compound; however, in general, a basic compound is introduced into the photosensitive material by placing, in an atmosphere of the basic compound, the photosensitive material which has been subjected to exposure (FIG 3(C)). At this time, the basic compound is uniformly introduced into both the exposed area and the unexposed area. However, the basic compound introduced is neutralized only in the exposed area. Therefore, a difference in the concentration of the basic compound is produced between the exposed area and unexposed area.

As decarboxylation proceeds in the step (4), an area 22 which is sparingly soluble in a developer, and an area 23 which is soluble in a developer are formed due to the difference in the concentration of the basic compound (FIG 3(D)). In this case, it is also possible to be carried out the basic compound absorbing process under the heating condition to cause the decarboxylation subsequently.

The reaction in the pattern forming process of the present invention occurs by utilizing a basic catalyst unlike in the cases where conventional chemically amplified resists are used. Therefore, according to the pattern forming process of the invention, a pattern can be formed by being scarcely affected by deactivated acidic substances present in the air or on the surface of a substrate; and changes in the sensitivity of the resist and in the profile of the resist pattern are hardly brought about by the environment or with the passage of time, such changes having been the drawback with conventional chemically amplified resists. In addition, the pattern forming process of the invention employs such a reaction mechanism that an extremely small amount of a basic catalyst is neutralized with an acid generated by the application of light, so that a pattern can be formed with a small exposure as in the cases where conventional chemically amplified resists are used.

<Photosensitive Material>

The photosensitive material for use in the pattern forming process of the present invention is such that a photosensitive composition comprising the following components has been coated onto a substrate:

(a) an acid generator which generates an acid when irradiated with actinic radiation, and (b) a compound containing carboxyl group, which can decompose upon by causing decarboxylation.

Further, it is also possible to use a photosensitive material prepared by coating, onto to a substrate, a photosensitive composition comprising the following components:

(a) an acid generator which generates an acid when irradiated with actinic radiation, (b) a compound containing carboxyl group, which can decompose by causing decarboxylation, and (c) a basic compound.

For the acid generator (a) which generates an acid when irradiated with actinic radiation, any acid generator which is commonly used in the art can be used. Examples of such compounds include onium salt compounds (e.g., sulfonium compounds, iodonium compounds, etc.), sulfonyl compounds, and sulfonic ester compounds. Specific examples of these compounds are as follows:
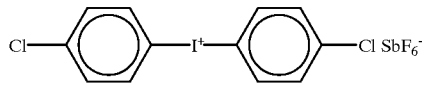
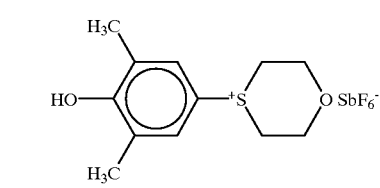
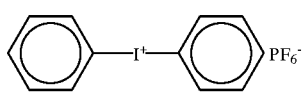
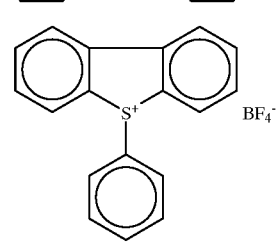
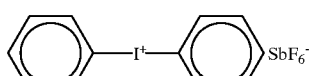
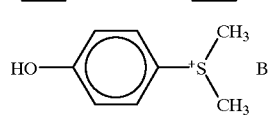
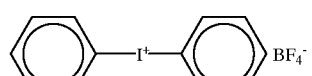
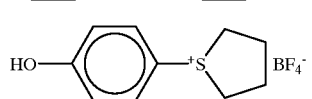
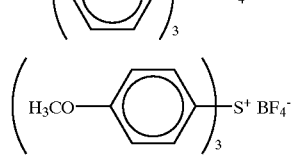
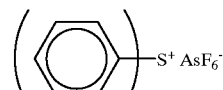
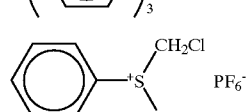
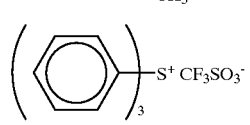
-continued
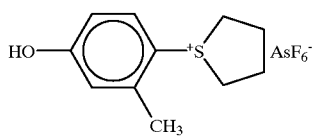
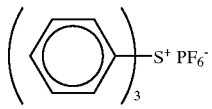
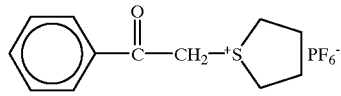
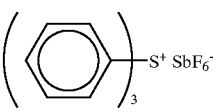
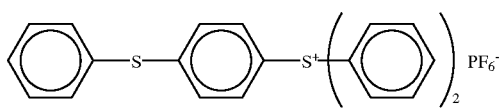
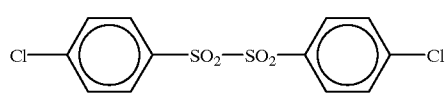
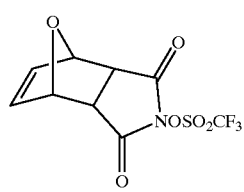
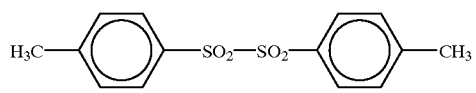
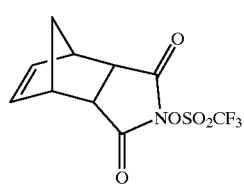
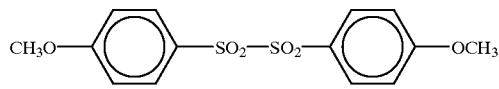
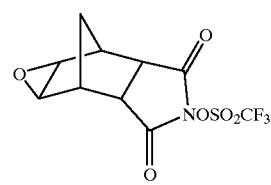
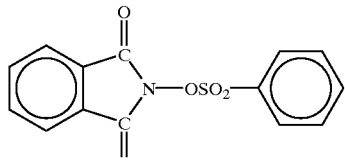

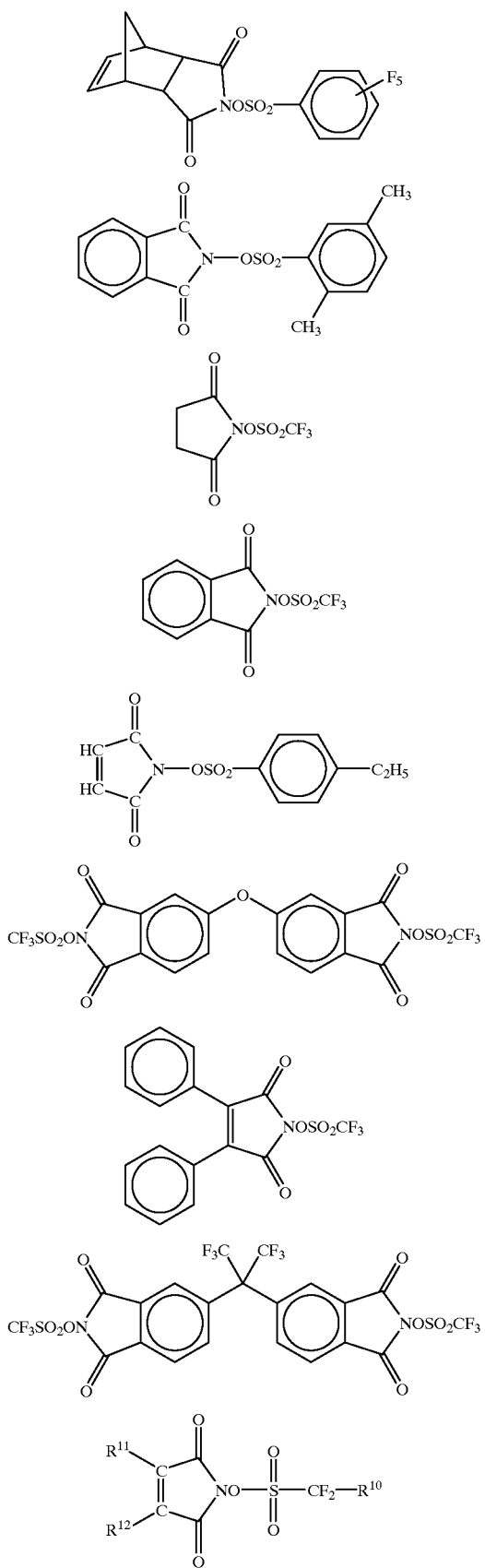

wherein $R^{10}$, $R^{11}$ and $R^{12}$, which may be the same or different, are a substituent selected from, for example, monovalent groups such as hydrogen, halogen, cyano and nitrile, monovalent alkyl groups such as methyl, ethyl and propyl, alkyl halide derivatives such as trifluoromethyl, aromatic substituents such as phenyl and naphthyl, alicyclic groups such as cyclohexyl, menthyl, norbornyl and isobornyl, and derivatives of these substituents;

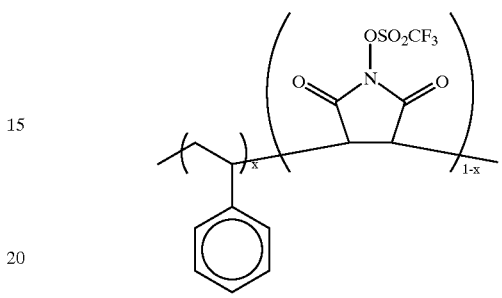

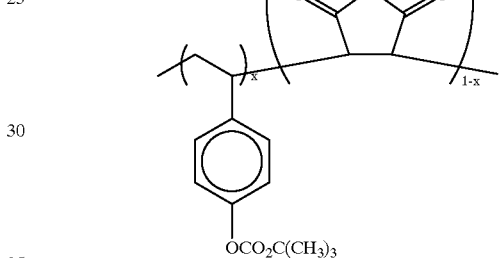

wherein x represents a proportion of each monomer component, and is a number ranging from 0 to 1;

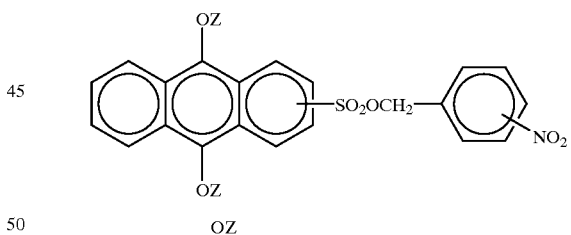

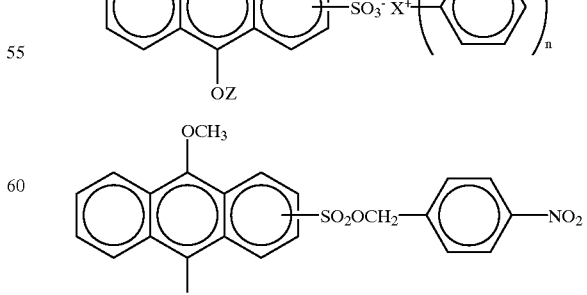

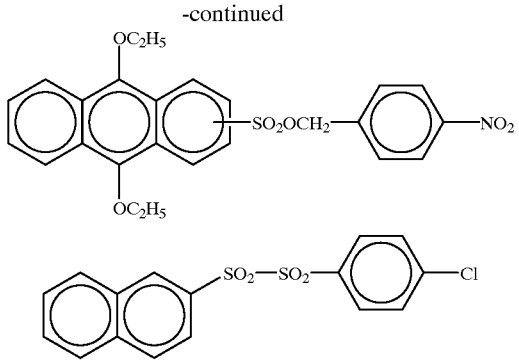

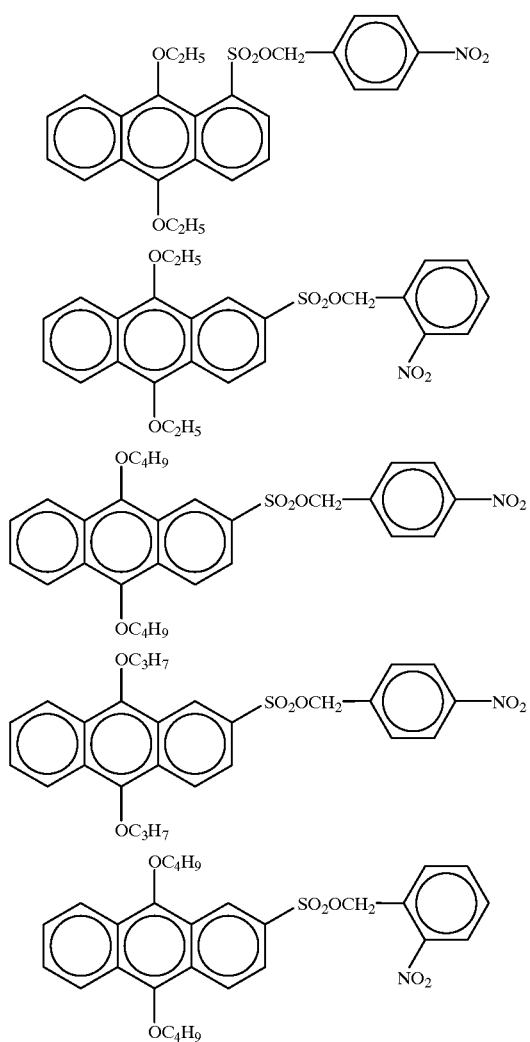

wherein Z is a substituent such as an alkyl, alkoxy, aryl or halogen, and X⁺— is a cationic group selected from, for example, sulfonium, iodonium and phosphonium; and When the photosensitive compound contains basic compound as a component, the equivalent of the acid generator is preferably not less than 0.5 times, more preferably not less than 1 time, particularly not less than 2 times the equivalent of the basic compound (c) to be introduced into the photosensitive material for use in the pattern forming process of the present invention. When the amount of the acid genera-tor to be added is smaller than the above-described amount, sufficiently high sensitivity may not be obtained.

For the compound containing carboxyl group, which can decompose by causing decarboxylation, any compound having carboxyl groups can be used. However, preferred are those compounds which readily cause decarboxylation by being catalyzed by basic compounds which will be described later in detail. Preferable carboxyl-group-containing compounds are those ones which have an electron attractive substituent or unsaturated bond at the α- or β-position of the carboxyl group. It is herein preferable that the electron attractive substituent be carboxyl group, cyano group, nitro group, an aryl group, carbonyl group, or a halogen. Further, it is preferable that the unsaturated bond be, if present, carbon-carbon double or triple bond.

Furthermore, any structure can be selected for the basic skeleton of the carboxyl-group-containing compound. It is however preferable for the carboxyl-group-containing compound to have the following characteristics: the absorbance at the wavelength of actinic radiation which is used for pattern-wise exposure is; and the basic skeleton itself of the compound does not show excessively high solubility in a developer. In addition, the carboxyl-group-containing compound also includes those compounds which have no carboxyl group at the time when the photosensitive material is prepared but which have an organic group capable of being converted to carboxyl group when the photosensitive material is subjected to such a treatment as exposure that is carried out after the preparation of the photosensitive material; for instance, naphthoquinone diazide derivatives. In this case, it is necessary that the sensitive wavelength of the acid generator be shorter than that of the above-described compound.

Examples of such carboxyl-group-containing compounds include α-cyanocarboxylic acid derivatives, α-nitrocarboxylic acid derivatives, α-phenylcarboxylic acid derivatives, α,β-olefin carboxylic acid derivatives, and β,γ-olefin carboxylic acid derivatives; and, more specifically, indene carboxylic acid derivatives which are photodisintegrated products of the above-described naphthoquinone diazide derivatives, cinnamic acid derivatives, 2-cyano-2-phenylbutanedioic acid derivatives, and polymers containing these groups. However, the carboxyl-group-containing compound useful herein is not limited to the above-enumerated compounds. Non-limitative specific examples of these compounds include the following: 2-cyano-phenylbutyric acid, 2-phenyl-sufonyl-2-methylbutyric acid, 2-phenyl-2,2-dithiophenylacetic acid, 4-phenoxy-sulfonyl-indene carboxylic acid, 4,4'-benzophenoneoxysulfonylindene carboxylic acid, 2-cyano-(4-biphenyl)butyric acid and polymers thereof, 4-(4-vinylphenoxy-sulfonyl)indene carboxylic acid and polymers thereof, and compounds obtainable by replacing a part of hydroxyl groups in novolak resins with 4-indene carboxylic acid sulfonic ester.

In the process of the present invention, any compound can be used as the basic compound as long as it can neutralize the acid generated by the acid generator and act as a catalyst for the decarboxylation of the carboxyl-group-containing compound. The basic compound can be either an organic compound or inorganic compound. Preferred compounds are nitrogen compounds, and specific examples thereof are as follows: (1) ammonia, (2) primary amines such as methylamine, ethylamine and butylamine, (3) secondary amines such as dimethylamine, diethylamine and dicyclohexyl-amine, (4) tertiary amines such as trimethylamine, triethylamine and tributyl- amine, (5)

nitrogen-containing heterocyclic compounds such as imidazole, pyridine, piperidine, piperazine, diazabicyclo [2,2,2]octane and hexamethylenetetramine, and salts thereof. The basic compound is introduced in a proportion of generally 0.1 to 30 parts by weight, preferably 0.3 to 15 parts by weight of the photosensitive composition. This proportion is applicable to both the case where the basic compound is incorporated into the photosensitive material when the photosensitive material is prepared and the case where the basic compound is introduced into the photosensitive material after the photosensitive material is subjected to exposure.

The photosensitive composition for use in the pattern forming process of the present invention may further comprise an alkali-soluble polymer in addition to the above-described components. For such a polymer, any of those compounds which are commonly used in photosensitive compositions for resists can be used. Specific examples of such polymers include novolak resins obtainable by condensation reaction between phenol derivatives and aldehyde compounds, polyhydroxystyrene, polyacrylic acid derivatives and polyamic acid; however, the polymers useful herein are not limited to these compounds.

Further, the photosensitive composition of the present invention may also contain, as a dissolution-suppressing agent, a compound having a group which is decomposed by the catalytic action of an acid to become alkali-soluble. Those groups which are decomposed by acids to become alkali-soluble are well known in the art, and specific examples of such groups include t-butoxycarbonyl, t-butyl ester, t-butyl ether, ethoxyethyl and tetrahydropyranyl groups.

The photosensitive composition of the present invention is generally prepared by dissolving the above-described components, and, when necessary, other additives such as surface active agents in an organic solvent, and, if necessary, by filtering the resulting solution through a membrane filter or the like. Any organic solvent which is usually used in the art can be used as the organic solvent for use herein. Specific examples of such organic solvents include (a) ketones such as cyclohexanone, acetone, ethyl methyl ketone and methyl isobutyl ketone, (b) Cellosolves such as methyl cellosolve, methyl cellosolve acetate, ethyl cellosolve acetate and butyl cellosolve acetate, and (c) esters such as ethyl acetate, butyl acetate, isoamyl acetate, γ-butyrolactone and 3-methoxymethyl propionate. Further, in order to improve the solubility, dimethyl sulfoxide, N,N-dimethylformamide, N-methylpyrrolidinone or the like can also be used depending upon the type of the photosensitive composition. Furthermore, lactic ester such as ethyl lactate, propylene glycol monoethyl acetate or the like can also be used as a low-toxic solvent.

For the substrate onto which the photosensitive composition is coated, any substrate which is known in the art can be used. Specific examples of such substrates include silicon wafers, doped silicon wafers, silicon wafers whose surfaces are provided with a variety of insulating films, electrodes or wires, mask blanks, and semiconductor wafers made from compounds belonging to the groups III to V, such as GaAs and AlGaAs. A chromium- or chromium-oxide-deposited substrate, aluminum-deposited substrate, BPSG-coated substrate, SOG-coated substrate or SiN-coated substrate can also be used.

Any method can be employed for coating the photosensitive composition onto the substrate; and a spin, dip, knife or curtain coating method, or the like can be used.

The coated photosensitive composition is dried by heating at a temperature of generally 170° C. or lower, preferably 70 to 120° C., thereby forming a photosensitive layer.

<Exposure Step>
The above-described photosensitive material is subjected to pattern-wise exposure to actinic radiation in the step (2). The exposure may be conducted by using a predetermined mask pattern, or by directly scanning the photosensitive layer by actinic radiation. Any actinic radiation can be used for the exposure as long as it can allow the acid generator to generate an acid. Specific examples of useful actinic radiation include ultraviolet light, i-, h- or g-lines emitted from mercury vapor lamps, xenon lamp light, deep UV light (e.g., KrF or ArF excimer laser light), X-rays, synchrotron orbital radiation (SOR), and electron beams.

<Neutralization Step>
When the photosensitive material is exposed to actinic radiation, the acid generator contained in the photosensitive material generates an acid. This acid is neutralized with the basic compound.

In the case where the photosensitive material contains the basic compound from the beginning, the neutralization of the acid generated by exposure is immediately initiated. Therefore, in this case, the exposure step and the neutralization step are to be effected in parallel.

On the other hand, when the photosensitive material contains no basic compound at the beginning, the basic compound is introduced into the photosensitive material which has been subjected to exposure.

The introduction of the basic compound is effected by placing, in a basic atmosphere, the photosensitive material which has been subjected to exposure. Specifically, the basic compound may be introduced into the photosensitive material in such a manner that the photosensitive material which has been subjected to exposure is either placed in a vapor of or dipped in a solution of any of the above-described basic compounds. Further, it is also possible to apply heat or pressure to the whole atmosphere including the photosensitive material, if necessary.

<Decarboxylation Step>
The photosensitive material in which the acid generated by the acid generator has been neutralized with the basic compound is then transferred to the decarboxylation step. In this step, the carboxyl-group-containing compound contained in the photosensitive material is allowed to cause decarboxylation.

The decarboxylation proceeds by being catalyzed by the basic compound, and is accelerated when conditions under which decarboxylation usually proceeds are further applied. In general, heating is selected for the conditions to be applied. Therefore, the photosensitive material which has been subjected to the neutralization step is often subjected to baking. This baking treatment can be carried out in any manner which is known in the art. In general, however, it is carried out by heating the photosensitive material on a hot plate or in a heating oven, or by the application of infrared rays. The heating is conducted generally at 200° C. or lower, preferably at 150° C. or lower. Further, this baking treatment can also be carried out in an atmosphere of the basic compound. By doing so, the decarboxylation can further be accelerated.

There is no particular limitation on the reaction mechanism of decarboxylation which proceeds in this step; and any reaction is acceptable as long as it follows the following decomposition reaction of a carboxylic acid into carbon dioxide and an organic residue:

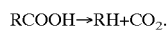

RCOOH→RH+CO$_2$.

Such a reaction mechanism is described, for example, in *Advanced Organic Chemistry: Reactions, Mechanisms, and*

Structure, (1968) Jerry MARCH, published by McGraw-Hill Book Company.

<Development Step>

Subsequently, the photosensitive material is developed by an alkaline developer. Any developer which is known in the art can be used herein. Specific examples of useful developers include (a) aqueous solutions of organic alkalis such as aqueous tetramethylammonium hydroxide solution, aqueous tetraethyl-ammonium hydroxide solution and aqueous choline solution, and (b) aqueous solutions of inorganic alkalis such as aqueous potassium hydroxide solution and aqueous sodium hydroxide solution. There is no limitation on the concentration of the alkaline developer. It is however preferable to make the concentration 15 mol % or less in order to obtain a great difference in dissolution rate between the exposed area and unexposed area in the photosensitive layer, that is, in order to make the dissolution contrast high. Further, an organic solvent can also be added to the developer, when necessary. Examples of organic solvents which can be used herein include (a) alcohols such as methanol, isopropanol and butanol, (b) ketones such as methyl isobutyl ketone and acetone, (c) aromatic solvents such as toluene and xylene, and (d) N-methylpyrrolidinone, dimethyl sulfoxide and N,N-dimethylformamide. The combination use of any two or more of the above-described aqueous solutions of alkalis and that of any two or more of the above-enumerated organic solvents are acceptable.

EXAMPLES

Example 1

1 g of an indene carboxylic acid derivative having the following formula (I):

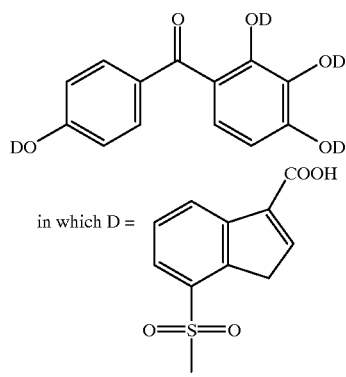

(I)

the degree of esterification of the derivative being 75%, and 4 g of novolak resin having the following formula (II):

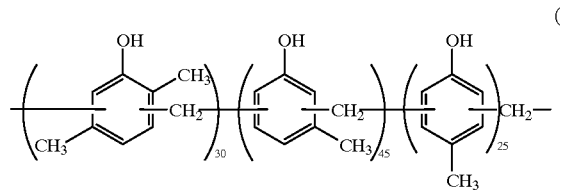

(II)

were dissolved in 20 g of methoxymethyl propionate. To this solution were added 0.05 mg of dicyclohexylamine and 0.13 g of triphenylsulfonium triflate (TPS-OTf) serving as the acid generator. The mixture was filtered through a membrane filter of 0.2 m to obtain a resist solution. This resist solution was spin-coated onto the surface of a silicon wafer, and then baked at 100° C. for 90 seconds to form a resist film having a thickness of 0.5 μm.

A predetermined pattern was formed in the above-obtained resist film by means of electron beam lithography, the acceleration voltage being 50 keV, the exposure being 15 μC/cm². After a predetermined period of time, the patterned resist film was subjected to post-exposure baking (PEB) at 130° C. for 9 minutes. Subsequently, only the exposed area was dissolved and removed by using, as the developer, a 0.14 N aqueous solution of tetramethylammonium hydroxide (TMAH), thereby obtaining a positive resist pattern.

The size of the pattern (0.15 μm L & S) was confirmed by changing the time interval $T_E$ between the electron beam exposure and PEB to 10 minutes, 1 hour, 2 hours and 24 hours. The results obtained are as shown in Table 1.

TABLE 1

| $T_E$ | Pattern Size |
|---|---|
| 10 minutes | 0.15 μm |
| 1 hour | 0.15 μm |
| 2 hours | 0.15 μm |
| 24 hours | 0.15 μm |

Example 2

1 g of a compound having the following formula (III):

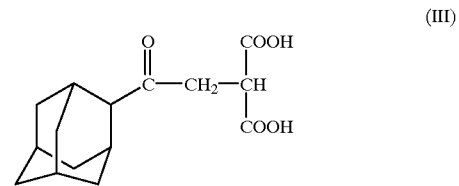

(III)

4 g of polyhydroxystyrene having a molecular weight of 12,000, 0.13 g of triphenylsulfonium triflate serving as the acid generator, and 0.05 g of dicyclohexylamine were dissolved in 25 g of methoxymethyl propionate. The solution was filtered through a membrane filter of 0.2 μm to obtain a resist solution. This resist solution was spin-coated onto the surface of a silicon wafer, and then baked at 100° C. for 90 seconds to form a resist film having a thickness of 0.5 μm.

A predetermined pattern was formed in the above-obtained resist film by using a stepper emitting KrF excimer laser light having a wavelength of 248 nm, the exposure being 22 mJ/cm². After a predetermined period of time, the patterned resist film was subjected to PEB at 130° C. for 9 minutes. Subsequently, only the exposed area was dissolved and removed by using, as the developer, a 0.108 N aqueous solution of TMAH to form a positive resist pattern.

The size of the pattern (0.25 μm L & S) was confirmed by changing the time interval $T_E$ between the KrF laser light exposure and PEB to 10 minutes, 1 hour, 2 hours and 24 hours. The results obtained are as shown in Table 2.

TABLE 2

| $T_E$ | Pattern Size |
|---|---|
| 10 minutes | 0.25 μm |
| 1 hour | 0.25 μm |

TABLE 2-continued

| $T_E$ | Pattern Size |
| --- | --- |
| 2 hours | 0.25 μm |
| 24 hours | 0.25 μm |

Example 3

1 g of an indene carboxylic acid derivative having the formula (I), and 4 g of novolak resin having the formula (II) were dissolved in 20 g of methoxymethyl propionate. To this solution, 0.13 g of TPS-OTf was added as the acid generator. The mixture was filtered through a membrane filter of 0.2 μm to obtain a resist solution. This resist solution was spin-coated onto the surface of a silicon wafer, and then baked at 100° C. for 90 seconds to form a resist film having a thickness of 0.5 μm.

A predetermined pattern was formed in the above-obtained resist film by means of electron beam lithography, the acceleration voltage being 50 keV, the exposure being 15 μC/cm². After a predetermined period of time, the patterned resist film was subjected to PEB in an atmosphere of ammonia in a heating oven at 130° C. for 60 minutes. Subsequently, only the exposed area was dissolved and removed by using, as the developer, a 0.14 N aqueous solution of TMAH to form a positive resist pattern.

The size of the pattern (0.15 μm L & S) was confirmed by changing the time interval $T_E$ between the exposure and PEB to 10 minutes, 1 hour, 2 hours and 24 hours. The results obtained are as shown in Table 3.

TABLE 3

| $T_E$ | Pattern Size |
| --- | --- |
| 10 minutes | 0.15 μm |
| 1 hour | 0.15 μm |
| 2 hours | 0.15 μm |
| 24 hours | 0.15 μm |

Example 4

A compound represented by the following formula (IV):

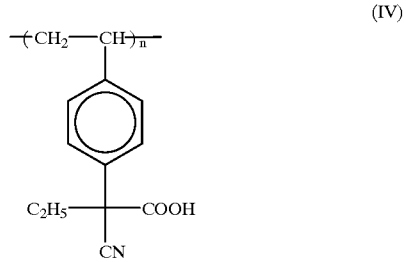

(IV)

0.13 g of TPS-OTf serving as the acid generator, and 0.05 g of dicyclohexylamine were dissolved in 25 g of methoxymethyl propionate. The solution was filtered through a membrane filter of 0.2 μm to obtain a resist solution. This resist solution was spin-coated onto the surface of a silicon wafer, and then baked at 100° C. for 90 seconds to form a resist film having a thickness of 0.5 μm.

A predetermined pattern was formed in the above-obtained resist film by using a stepper emitting KrF excimer laser light having a wavelength of 248 nm, the exposure being 15 mJ/cm². After a predetermined period of time, the patterned resist film was subjected to PEB at 140° C. for 15 minutes. Subsequently, only the exposed area was dissolved and removed by using, as the developer, a 0.108 N aqueous solution of TMAH to form a positive resist pattern.

The size of the pattern (0.25 μm L & S) was confirmed by changing the time interval $T_E$ between the exposure and PEB to 10 minutes, 1 hour, 2 hours and 24 hours. The results obtained are as shown in Table 4.

TABLE 4

| $T_E$ | Pattern Size |
| --- | --- |
| 10 minutes | 0.25 μm |
| 1 hour | 0.25 μm |
| 2 hours | 0.25 μm |
| 24 hours | 0.25 μm |

Example 5

1 g of a compound represented by the following formula (V):

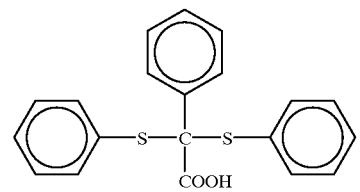

(V)

4 g of novolak resin having the formula (II), 0.13 g of TPS-OTf serving as the acid generator, and 0.05 g of dicyclohexylamine were dissolved in 25 g of methoxymethyl propionate. The solution was filtered through a membrane filter of 0.2 μm to obtain a resist solution. This resist solution was spin-coated onto the surface of a silicon wafer, and then baked at 100° C. for 90 seconds to form a resist film having a thickness of 0.5 μm.

A predetermined pattern was formed in the above-obtained resist film by means of electron beam lithography, the acceleration voltage being 50 keV, the exposure being 13 C/cm². After a predetermined period of time, the patterned resist film was subjected to PEB in an atmosphere of ammonia in a heating oven at 100° C. for 10 minutes. Subsequently, only the exposed area was dissolved and removed by using, as the developer, a 0.14 N aqueous solution of TMAH to form a positive resist pattern.

The size of the pattern (0.15 μm L & S) was confirmed by changing the time interval $T_E$ between the exposure and PEB to 10 minutes, 1 hour, 2 hours and 24 hours. The results obtained are as shown in Table 5.

TABLE 5

| $T_E$ | Pattern Size |
| --- | --- |
| 10 minutes | 0.15 μm |
| 1 hour | 0.15 μm |
| 2 hours | 0.15 μm |
| 24 hours | 0.15 μm |

Example 6

5 g of a compound represented by the following formula (VI):

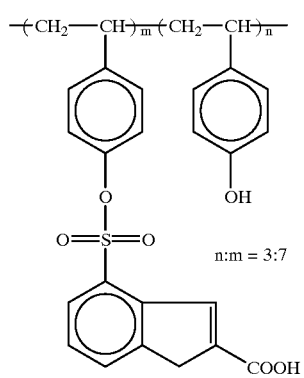

(VI)

0.13 g of TPS-OTf serving as the acid generator, and 0.05 g of dicyclohexylamine were dissolved in 25 g of methoxymethyl propionate. The solution was filtered through a membrane filter of 0.2 μm to obtain a resist solution. This resist solution was spin-coated onto the surface of a silicon wafer, and then baked at 100° C. for 90 seconds to form a resist film having a thickness of 0.5 μm.

A predetermined pattern was formed in the above-obtained resist film by means of electron beam lithography, the acceleration voltage being 50 keV, the exposure being 20 μC/cm². After a predetermined period of time, the patterned resist film was subjected to PEB in an atmosphere of ammonia in a heating oven at 100° C. for 10 minutes. Subsequently, only the exposed area was dissolved and removed by using, as the developer, a 0.14 N aqueous solution of TMAH to form a positive resist pattern.

The size of the pattern (0.15 μm L & S) was confirmed by changing the time interval $T_E$ between the exposure and PEB to 10 minutes, 1 hour, 2 hours and 24 hours. The results obtained are as shown in Table 6.

TABLE 6

| $T_E$ | Pattern Size |
| --- | --- |
| 10 minutes | 0.15 μm |
| 1 hour | 0.15 μm |
| 2 hours | 0.15 μm |
| 24 hours | 0.15 μm |

Comparative Example 1

To 100 parts by weight of a polymer obtained by replacing, with t-butoxycarbonyl group, 30 mol % of hydroxyl group contained in polyhydroxystyrene having a molecular weight of 12,000, 1 part by weight of triphenylsulfonium triflate was added as the acid generator. This mixture was dissolved in polyethylene glycol monoethyl acetate (PEGMEA) to obtain a resist solution. This resist solution was spin-coated onto the surface of a silicon wafer to form a resist film having a thickness of 0.16 μm. A predetermined pattern was formed in this resist film by using either electron beams or KrF excimer laser light. After a predetermined period of time, the patterned resist film was subjected to PEB at 100° C. for 2 minutes. Subsequently, only the exposed area was dissolved and removed by using, as the developer, a 0.21 N aqueous solution of TMAH to form a positive resist pattern.

The size of the pattern (0.15 μm L & S) was confirmed by changing the time interval $T_E$ between the exposure and PEB to 10 minutes, 1 hour, 2 hours and 24 hours, and by using either electron beams with an acceleration voltage of 50 keV (exposure: 15 μC/cm²) or KrF excimer laser light (exposure: 25 mJ/cm²). The results obtained are as shown in Table 7.

TABLE 7

| $T_E$ | KrF | Electron Beams |
| --- | --- | --- |
| 10 minutes | 0.25 μm | 0.15 μm |
| 1 hour | 0.30 μm | 0.17 μm |
| 2 hours | 0.35 μm | 0.19 μm |
| 24 hours | X | X |

In the above table, "X" shows that, since a resist film poor in solubility was formed on the surface of the wafer, the resist pattern was not able to be formed.

What is claimed is:

1. A pattern forming process comprising the steps of:
   (1) preparing a photosensitive material by coating, onto the surface of a substrate, a photosensitive composition comprising the following components:
      (a) an acid generator which generates an acid when irradiated with actinic radiation, and
      (b) a compound containing carboxyl group, which can decompose upon decarboxylation,
   (2) subjecting the photosensitive material to pattern-wise exposure to actinic radiation, thereby allowing the acid generator (a) to generate an acid in the exposed area,
   (3) neutralizing the acid generated in the exposed area with a basic compound (c),
   (4) allowing the carboxyl group in the carboxyl-group-containing compound (b) in the unexposed area to decarboxylate by applying conditions under which the decarboxylation proceeds by being catalyzed by the basic compound (c), and
   (5) developing the photosensitive material.

2. The pattern forming process according to claim 1, wherein the photosensitive material contains the basic compound (c) as a resist component.

3. The pattern forming process according to claim 1, wherein the acid generated in the exposed area is neutralized by placing, in an atmosphere of the basic compound (c), the photosensitive material which has been subjected to the pattern-wise exposure.

4. The pattern forming process according to claim 1, wherein the carboxyl-group-containing compound (b) has an electron attractive substituent or unsaturated bond at the α- or β-position of the carboxyl group.

5. The pattern forming process according to claim 1, wherein the carboxyl-group-containing compound (b) is selected from the group consisting of α-cyanocarboxylic acid derivatives, α-nitrocarboxylic acid derivatives, α-phenyl-carboxylic acid derivatives, α,β-olefin carboxylic acid derivatives, and β, γ-olefin carboxylic acid derivatives.

6. The pattern forming process according to claim 1, wherein the carboxyl-group-containing compound (b) is an indene carboxylic acid derivative, cinnamic acid derivative or 2-cyano-2-phenylbutane derivative.

7. The pattern forming process according to claim 1, wherein the decarboxylation is carried out at an elevated temperature.

8. The pattern forming process according to claim 7, wherein the decarboxylation is carried out at a temperature of 200° C. or lower.

9. The pattern forming process according to claim 1, wherein the acid generator (a) is selected from the group consisting of onium salt compounds, sulfonyl compounds and sulfonic ester compounds.

10. The pattern forming process according to claim 1, wherein the equivalent of the acid generator (a) contained in the photosensitive material is not less than 0.5 times the equivalent of the basic compound (c).

11. The pattern forming process according to claim 1, wherein the basic compound (c) is a nitrogen compound.

12. The pattern forming process according to claim 1, wherein the photosensitive composition further comprises an alkali-soluble polymer.

13. A pattern forming process comprising the steps of:
  (1) coating a substrate with a photosensitive material, said photosensitive material comprising
    (a) an acid generator which generates an acid when irradiated with actinic radiation, and
    (b) a carboxyl compound containing a carboxyl group, which can decompose upon decarboxylation,
  (2) exposing a part of said photosensitive material to actinic radiation, thereby allowing the acid generator to generate an acid from the exposed area,
  (3) neutralizing the acid generated from the photosensitive material in the exposed area with a basic compound, which can neutralize the acid and which can act as a catalyst for the decarboxylation of the carboxyl compound in the exposed area,
  (4) causing decarboxylation of the carboxyl compound in the unexposed area, being catalyzed by the basic compound, and
  (5) developing the photosensitive material.

* * * * *